US009311106B1

(12) United States Patent
Jones

(10) Patent No.: US 9,311,106 B1
(45) Date of Patent: Apr. 12, 2016

(54) MULTIPLE RECONFIGURATION PROFILES FOR DYNAMICALLY RECONFIGURABLE INTELLECTUAL PROPERTY CORES

(71) Applicant: Altera Corporation, San Jose, CA (US)

(72) Inventor: Jakob Jones, San Jose, CA (US)

(73) Assignee: Altera Corporation, San Jose, CA (US)

( * ) Notice: Subject to any disclaimer, the term of this patent is extended or adjusted under 35 U.S.C. 154(b) by 268 days.

(21) Appl. No.: 14/045,643

(22) Filed: Oct. 3, 2013

(51) Int. Cl.
*G06F 9/44* (2006.01)

(52) U.S. Cl.
CPC .................................. *G06F 9/4403* (2013.01)

(58) Field of Classification Search
CPC ..................................................... G06F 9/4403
See application file for complete search history.

(56) References Cited

U.S. PATENT DOCUMENTS

| 5,109,503 | A | * | 4/1992 | Cruickshank | H03K 21/00 703/24 |
| 6,912,706 | B1 | * | 6/2005 | Stamm | G06F 15/7867 716/117 |
| 7,979,827 | B1 | * | 7/2011 | Trimberger | G06F 17/5054 716/117 |
| 8,786,310 | B1 | * | 7/2014 | Lu | G06F 7/38 326/38 |
| 8,917,111 | B1 | * | 12/2014 | Puranik | H03K 19/17748 326/38 |
| 2011/0302356 | A1 | * | 12/2011 | Helton | G11C 7/222 711/103 |
| 2013/0297907 | A1 | * | 11/2013 | Ki | G06F 12/0684 711/170 |
| 2014/0181489 | A1 | * | 6/2014 | Vicente | G06F 9/45558 713/2 |

* cited by examiner

*Primary Examiner* — Thomas Lee
*Assistant Examiner* — Chad Erdman
(74) *Attorney, Agent, or Firm* — Weaver Austin Villeneuve & Sampson LLP

(57) ABSTRACT

Techniques and mechanisms allow for implementing multiple configuration profiles for dynamic reconfiguration of an Intellectual Property (IP) core. A minimum set of data may be generated, as well as detecting errors between the configuration profiles.

17 Claims, 7 Drawing Sheets

Transceiver Configuration Profiles

Configuration Files

☑ Generate SystemVerilog package file — 305

☑ Generate C header file — 310

☑ Generate Memory Initialize File (MIF) — 315

Configuration Profiles — 320

| Parameters | Profile 1 | Profile 2 |
|---|---|---|
| Data Rate | 1250 | 2500 |
| Mode | Tx/Rx | Tx |
| Number of Channels | 1 | 1 |

Errors — 325

Error: Cannot switch Mode setting between Profile 1 and Profile 2

FIGURE 3

MULTIPLE RECONFIGURATION PROFILES FOR DYNAMICALLY RECONFIGURABLE INTELLECTUAL PROPERTY CORES

TECHNICAL FIELD

This disclosure generally relates to integrated circuits. More specifically, the disclosure relates to systems and methods for implementing reconfiguration profiles for dynamically reconfigurable Intellectual Property (IP) cores.

DESCRIPTION OF THE RELATED TECHNOLOGY

A programmable logic device (PLD) is a semiconductor integrated circuit which contains logic circuitry and routing that may be configured to perform a host of logic functions. In a typical scenario, a designer uses electronic design automation (EDA) tools to create a design. These tools use information regarding the hardware capabilities of a given programmable logic device to help the designer implement the custom logic using multiple resources available on that given programmable logic device.

In some scenarios, a designer of a PLD may wish to reconfigure an IP core. For instance, an IP core may include a variety of different configurations. Accordingly, the designer may wish to change configuration settings to alter the functionality of the IP core.

SUMMARY

The subject matter described herein provides techniques for managing, generating, and using multiple configurations for an IP core.

In some scenarios, a designer of a PLD may wish to have an IP core change functionality or features. For instance, an IP core may have several possible configurations. Accordingly, the designer may wish to have the IP core switch from one configuration to another. In some implementations, the configuration of the IP cores may be associated with registers. The settings of the registers may be changed to switch between configurations.

However, generating configurations, determining the settings of registers to implement the configurations, determining whether settings changed from one configuration to another is supported, and other issues may arise. Additionally, generating configurations may be time-intensive.

Allowing a proper and efficient generation of configurations of IP cores may be advantageous. In one example, a configuration profile may be received. Accordingly, configuration data may be generated. A second configuration profile may be received, and configuration data associated with the second profile may also be determined. In some implementations, the differences of register settings between the profiles may be determined to generate a minimal set of configuration data. Additionally, the settings for the configurations may be checked for errors.

These and other features will be presented in more detail in the following specification and the accompanying figures, which illustrate by way of example.

BRIEF DESCRIPTION OF THE DRAWINGS

FIG. 3 illustrates a graphical user interface (GUI) for providing configuration profiles of an IP core in accordance with some implementations.

DETAILED DESCRIPTION OF PARTICULAR EMBODIMENTS

The techniques and mechanisms disclosed herein are primarily described with reference to programmable logic devices (PLDs) such as Field Programmable Gate Arrays (FPGAs), but are not necessarily limited to PLDs. Though some examples of implementations involve PLDs, the techniques and mechanisms may also be implemented in application specific integrated circuits (ASICs), structured ASICs, and other devices.

Figure 1A:
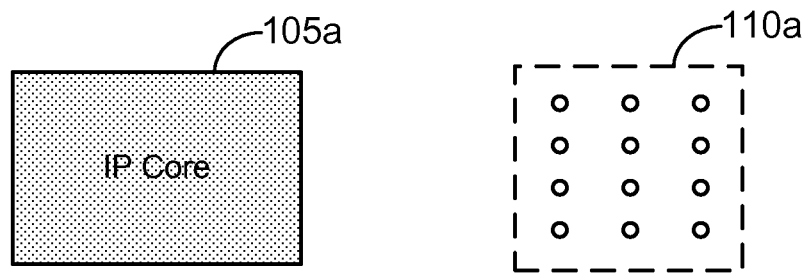
FIG. 1A illustrates an IP core and its associated registers.

FIG. 1A illustrates an IP core and its associated registers. In FIG. 1A, IP core 105a may include circuitry providing a variety of functionality. In some implementations, certain functionality of IP core 105a may be changed. For example, IP core 105a may be a transceiver that can operate at 1250 megabits per second (Mbps) or 2500 Mbps. Accordingly, the transceiver IP core may be associated with different configurations, some using 1250 Mbps and others using 2500 Mbps.

Configuration registers 110a in FIG. 1A illustrates a simplified representation of registers associated with IP core 105a. Configuration registers 110a may be set to provide the different functionalities of IP core 105a.

Figure 1B:
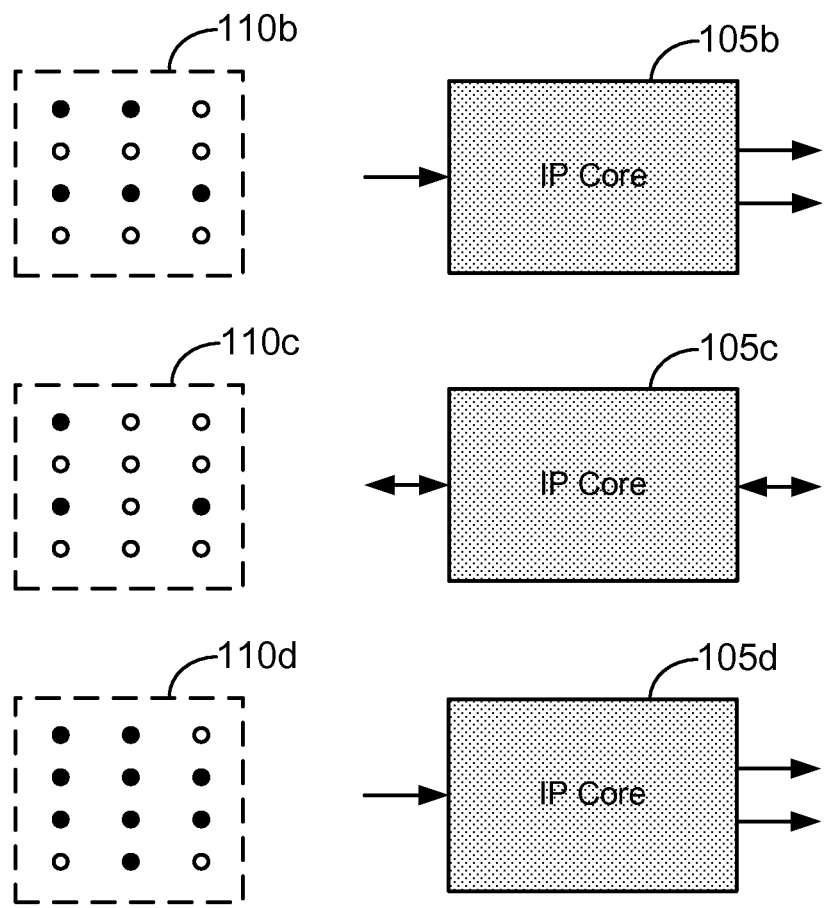
FIG. 1B illustrates settings of registers for implementing a variety of configurations of an IP core.

For example, FIG. 1B illustrates settings of registers for implementing a variety of configurations of an IP core. In FIG. 1B, configuration registers 110b provide configuration settings for IP core 105b. That is, configuration settings 110b indicate the configuration, and therefore functionality, of IP core 105b.

In FIG. 1B, configuration registers 110b indicate a particular configuration. For example, in FIG. 1B, the five registers represented as filled circles may indicate that a particular register is set high. The remaining seven registers may be set low. The registers at these particular settings may indicate that IP core 105a shall be configured to have the functionality of IP core 105b. That is, IP core 105b may include an input and two outputs because of the settings of configuration registers 110b.

However, IP core 105c may include a different configuration. That is, the functionality of IP core 105c differs from the functionality of IP core 105b. In FIG. 1B, configuration registers 110c provide configuration settings for IP core 105c. The settings of configuration registers 110c differ from the settings of configuration registers 110b. Configuration registers 110c includes three registers set high and nine registers set low. Accordingly, IP core 105c is configured to include two bi-directional ports rather than an input and two outputs as for IP core 105b.

Likewise, IP core 105d may also include a different configuration. IP Core 105d may include the same number and types of Inputs/Outputs (IOs) as IP core 105b. That is, IP core 105d is configured to have one input and two outputs. However, configuration registers 110*d* associated with IP core 105*d* include nine registers set high and three registers set low. The same registers set high from configuration registers 110*b* are also set high in configuration registers 110*d*, and therefore, provide the particular inputs and outputs. However, the three other registers may provide additional functionality or features. For example, IP core 105*b* may be set to 1250 Mbps. However, IP core 105*d* may be set to 2500 Mbps due to the settings of the three additional registers in configuration registers 110*d*.

Though the above example describes dynamically reconfiguring an IP core to change its interface (e.g., transitioning from one I/O to multiple I/Os), in some implementations as described later herein, the interface may not be allowed to change between configurations, and therefore, an error may be generated to prevent the configurations. However, the behavior of the interface may change (e.g., transitioning between data rates).

The implementations of FIGS. 1A and 1B utilize registers. However, other elements may be used rather than registers. For example, other types of memory, such as flash memory, SRAM, DRAM, etc. may be used.

Figure 2:
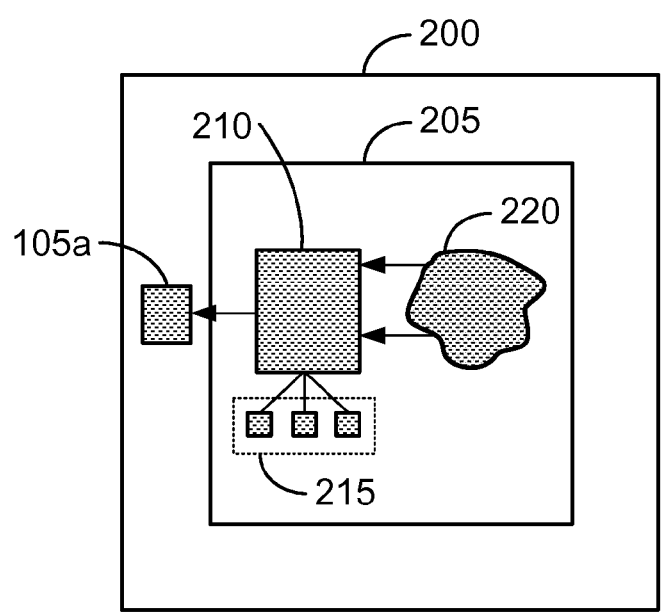
FIG. 2 illustrates a device with logic interfacing with an IP core.

FIG. 2 illustrates a device with logic interfacing with an IP core. In FIG. 2, device 200 may include soft logic 205 (e.g., the configurable logic of an FPGA). Reconfiguration logic 210 may be programmed or configured in soft logic 205. Reconfiguration logic 210 may interface with IP core 105*a* in hard logic of device 200. In particular, reconfiguration logic 210 may provide data for settings of configuration registers such that IP core 105*a* may be dynamically reconfigured from one configuration to another (e.g., the configuration of IP core 105*b* to 105*c* or 105*d*).

Though IP core 105*a* is implemented in hard logic in FIG. 2, IP core 105*a* may also be implemented in soft logic 205. Additionally, all of the logic of FIG. 2 may be implemented in either soft logic or hard logic, or a mix of both soft logic and hard logic. Additionally, any of the logic may be implemented off-chip. That is, the logic in FIG. 2 may be implemented across a variety of devices. For example, configuration settings 215 may be stored in off-chip memory which is accessed by reconfiguration logic 210.

Configuration settings 215 may include configuration data for settings of configuration registers 110*b*, 110*c*, and 110*d*. In FIG. 2, configuration settings 215 are also implemented in soft logic 205. Additionally, design 220 is also incorporated in soft logic 205. Design 220 may include logic that may prompt reconfiguration logic 210 to dynamically reconfigure IP core 105*a* to another configuration.

For example, IP core 105*a* may be configured with one input and two outputs operating at 1250 Mbps, as in IP core 105*b*. Design 220 may determine that IP core 105*a* should be reconfigured to the functionality of IP core 105*d* (i.e., operate at 2500 Mbps). Accordingly, design 220 may provide data to reconfiguration logic 210 indicating that the configuration of IP core 105*a* should change and an indication as to which configuration stored in configuration settings 215 should be used to reconfigure IP core 105*a*. Reconfiguration logic 210 may then provide the appropriate settings for the configuration registers of IP core 105*a* such that the core may be dynamically reconfigured during run-time to change functionality, and therefore, now operate at 2500 Mbps.

In some implementations, an IP core may include upwards of thousands of registers that may provide a multitude of functionalities. Additionally, the registers, available by address and set to particular bit values, do not provide an easy-to-understand representation of the features that may be configured for an IP core.

Accordingly, a designer may be provided with documentation with a register map providing addresses of the registers used to configure an IP core (e.g., configuration registers 110*a* for IP core 105*a*). The designer may be provided with details such as the meaning of each register in the register space, the address locations, and values that they may be set at (e.g., 1 or 0 for a 1-bit register; 00, 01, 10, 11 for a 2-bit register setting, etc.). However, in such an implementation, the designer must sufficiently understand the register map and then implement associated logic in soft logic 205 to dynamically reconfigure IP core 105*a*.

In another implementation, a designer can use a software "wizard" providing a GUI to generate hardware description logic (HDL) modules for each configuration of the IP core that the designer is expecting to dynamically reconfigure among. The designer may then look at the settings of each configuration's module to determine the differences and then use documentation to map the settings to register addresses and bit values. Additionally, the logic associated to dynamically reconfigure the IP core may also be implemented by the designer.

In an implementation, a designer may use a wizard GUI that generates the configured HDL modules and compiles the design. A file with the register settings, such as a memory initialization file, may also be generated and stored in memory. However, the designer may repeat the process for each configuration of the IP core. The designer may then utilize a module such as reconfiguration logic 210 that is capable of reading the register settings from the memory, process the data, and write the appropriate values to the IP block's registers, or provide the data to the IP block's dynamic reconfiguration interface.

However, the aforementioned implementations may only be aware of a single configuration at a time, and therefore, cannot determine if switching between the configurations may result in an error. Some settings may need to be consistent among the configurations. As an example, ports configured in one configuration may need to be available across every configuration. That is, a port may not be enabled in one configuration and disabled in another configuration.

Additionally, the settings may be provided upon running through the full design generation and compilation process once for each configuration of the IP block. Large designs may take hours or days, and therefore, running through the design process flow for each configuration may not be efficient.

Also, the aforementioned implementations provide every register setting for an implementation rather than only the settings that have changed, and therefore, include large amounts of data to be written to registers. For example, the configuration registers 110*b* and 110*c* include twelve registers. However, only two registers are actually different between the two different configurations. The two registers may be the only registers that need to be changed to transition from the configuration of IP core 105*b* to IP core 105*c*, or vice versa.

An implementation that allows efficient generation of configuration profiles and associated data, reduces the amount of data by determining the differences of register settings, and determines errors between different configurations may use a software GUI to allow a designer to dynamically reconfigure an IP core during run-time. A GUI may provide a variety of features or functionalities to be selected for a configuration of an IP core. For example, for a transceiver, settings such as a transceiver mode, number of channels, data rate, bonding options and other features may be selected for a configuration of an IP core in order to generate a configuration profile. Each feature may be associated with one or more registers that may be set to particular bits such that the feature is implemented in the IP core. As such, multiple configurations for an IP core may be created from the GUI.

FIG. 3 illustrates a graphical user interface (GUI) for providing configuration profiles of an IP core in accordance with some implementations. In FIG. 3, the GUI may summarize the selected features of configurations of an IP core in configuration profiles 320. Configuration files 305, 310, and 315 may be options that can be selected to generate data files. The data files may include configuration data providing registers settings of the separate configurations of the IP core. Errors 325 may provide indications of incompatibilities that may arise between the profiles in configuration profiles 320.

For example, configuration profiles 320 may show two different configurations for an IP core. Though only two configurations are shown in FIG. 3, one, three, or more configurations may be provided. A variety of parameters and the settings of those parameters for each configuration of the IP core may be provided in configuration profiles 320. In FIG. 3, parameters include data rate, mode, and number of data channels for a transceiver IP core. Profile 1 may be associated with a configuration with a 1250 Mbps data rate, a mode indicating both transceiver and receiver operation, and one data channel. Profile 2 may be associated with another configuration of the IP core. The second configuration indicates that the IP core may be configured to have a data rate of 2500 Mbps, operate only in transceiver mode, and have one data channel.

Accordingly, all of the configurations and their associated settings for the IP core may be known to the software in FIG. 3. Since the configurations are all available at the same time, the settings for all of the registers to configure the IP core may be generated at the same time, and in multiple formats. For example, configuration files 305, 310, and 315 provide multiple formats for generating the configuration settings. Additionally, in some implementations, the compilation process may only be run through once with all of the configurations available at the same time. Moreover, the logic such as reconfiguration logic 210, configuration settings 215, and associated interconnect routing may be implemented and inserted into a design.

Errors 325 may provide errors in the parameters or settings of profiles. For example, in one implementation, a transceiver IP core may need to operate in the same mode for all configurations. That is, in configuration profiles 320, the mode parameters may need to be the same between all of the profiles (e.g., profile 1 and profile 2 in FIG. 3). However, a designer may input configurations that include settings that are different, but may need to be the same across all configurations that the IP core is expected to transition among. Accordingly, upon determining that the two profiles have different modes, the software may provide, via the GUI interface of errors 325, an indication that the transition between the two configurations is incompatible. In some implementations, the GUI may fix or change the settings to allow compatibility. For example, the second profile may be changed to Tx/Rx mode indicating that it may receive and transmit rather than transmit only. In some implementations, the settings may change such that a profile with a narrower configuration may take on a broader configuration. For example, in FIG. 3, profile 1 includes a mode with both transceiver and receiver and profile 2 includes a mode with transceiver only. Accordingly, profile 2 may be changed to the setting of profile 1 (i.e., transceiver and receiver mode) because the setting of profile 1 is broader (i.e., includes both transceiver and receiver) than the setting of profile 2 (i.e., includes only transceiver). A message indicating the incompatibility and any alterations may be provided in errors 325 in the GUI of FIG. 3.

Accordingly, a variety of rules may be checked to determine if there is an incompatibility or error between the configurations or profiles of an IP core. In some implementations, errors may result because particular registers are not accessible to reconfiguration controller 210 or the particular configuration has not been modeled in the software.

Other examples of rules for a transceiver IP core may include the number of channels for a transceiver IP core may be consistent among configurations. Additionally, opening or allowing certain ports or I/Os may also need to be consistent among configurations of an IP core. Moreover, bonding options for transceivers may also need to be consistent among configurations. For example, transmitters may be grouped together to reduce skew across the transceivers. A transceiver IP core may not be able to be reconfigured from a configuration with a bonded setting to a configuration with a non-bonded configuration. Additionally, in a bonded configuration, a channel may act as a control master which may need to be maintained among the configurations.

Other IP cores, such as phase locked loops (PLLs) may also be dynamically reconfigured during run-time. Rules involving PLLs may include the ports being the same for every configuration. That is, if a port is used in one configuration, then it must be open in all other configurations. In some implementations, switching between reference clock sources may also lead to an error. In some implementations, the clock network that the PLL is driving out to may not be changed between configurations. In another implementation, a PLL may not be able to drive out to particular clock networks, and therefore, registers associated with the clock networks may not be set to a clock network that the PLL cannot access. For example, a particular PLL IP core may only be able to access clock networks in one quadrant of the device. If a configuration reconfigures the registers associated with the clock network to a clock network in another quadrant, an error may be generated.

In some implementations, a minimal set of configuration data may be generated. For example, all of the different configurations (e.g., configuration profiles 320) may be analyzed for the differences in settings. As previously discussed, the settings may be associated to a variety of registers. Accordingly, only configuration data associated with the registers that are different between the configurations may be generated. As such, reconfiguration logic 210 may use the minimal set of data (e.g., stored in configuration settings 215) and reconfigure IP core 105a faster. Additionally, configuration settings 215 may take up less memory, or if implemented in soft logic 205, take up less placement and routing resources, and therefore, allow more resources to be available to other functionality.

Figure 4:
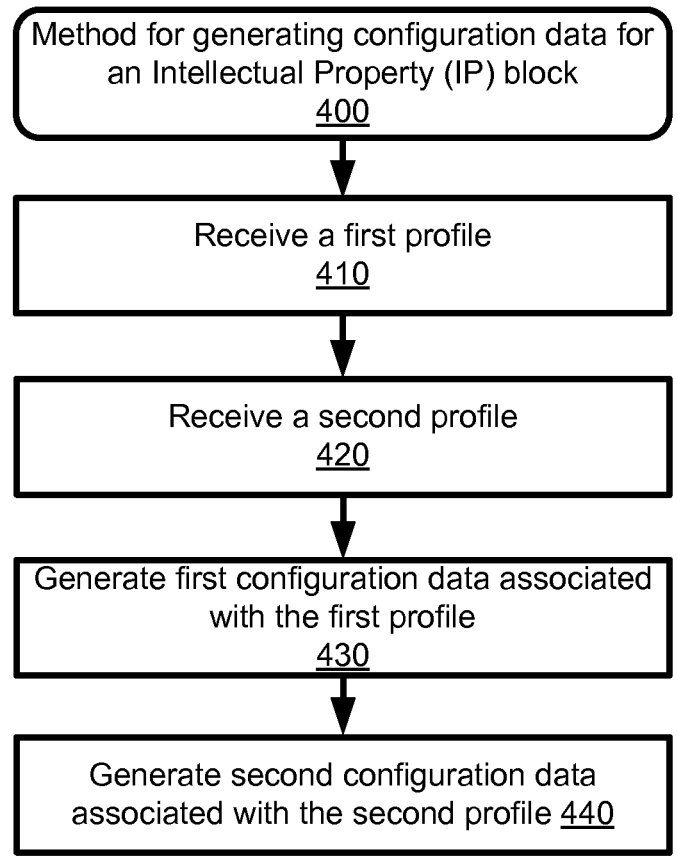
FIG. 4 is a flowchart illustrating a process flow for generating configuration data for an IP block in accordance with some implementations.

FIG. 4 is a flowchart illustrating a process flow for generating configuration data for an IP block in accordance with some implementations. In FIG. 4, at block 410, a first profile may be received. As previously discussed, the profile may include configuration settings for an IP core. At block 420, a second profile may be received. Accordingly, configuration data, such as register addresses and settings (e.g., bit values) may be generated at block 430. At block 440, configuration data for the second configuration of the IP core may be generated.

Figure 5:
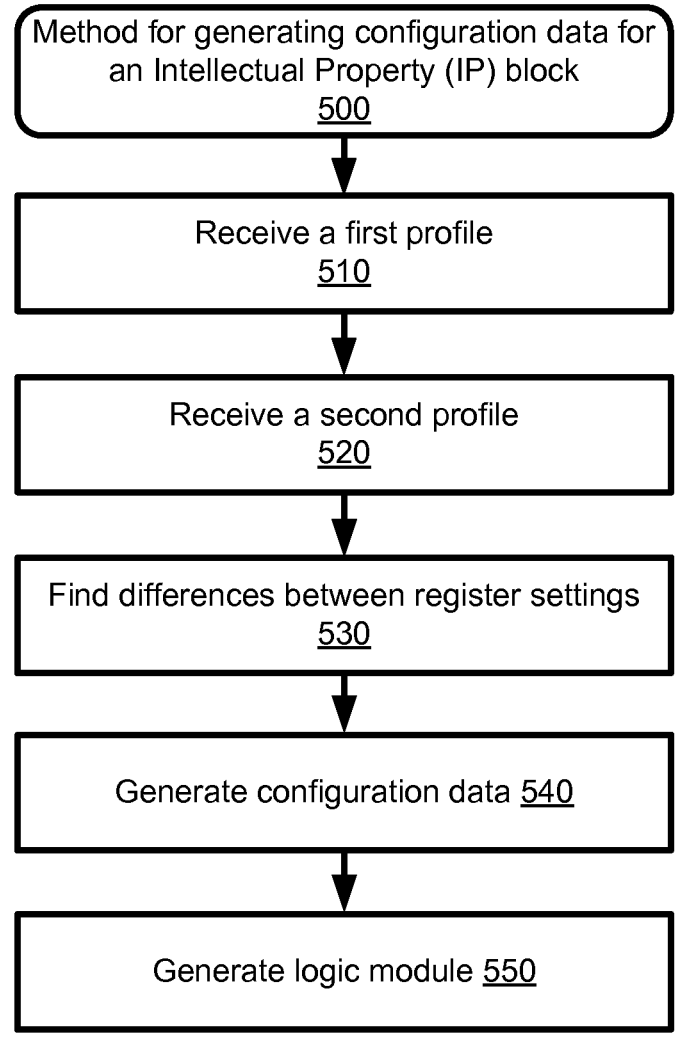
FIG. 5 is another flowchart illustrating a process flow for generating configuration data for an IP block in accordance with some implementations.

FIG. 5 is another flowchart illustrating a process flow for generating configuration data for an IP block in accordance with some implementations. In FIG. 5, at block 510, a first profile of a configuration of an IP core may be received. In block 520, a second profile may be received. Accordingly, at block 530, the differences of the registers settings for each configuration may be determined. That is, data (e.g., addresses and bit values) for a subset of registers used in the two configurations that are different may be determined. In block 540, configuration data for both of the profiles may be generated. In some implementations, the configuration data may include a subset of the total registers used in the configurations of the IP core. For example, only the registers that are changed between the configurations may be provided in the generated configuration data.

At block 550, a logic module may be generated. For example, reconfiguration logic 210 and configuration settings 215 may be generated, as well as connections from design 220 to reconfiguration logic 220 and connections from reconfiguration logic 210 to IP core 105a.

Figure 6:
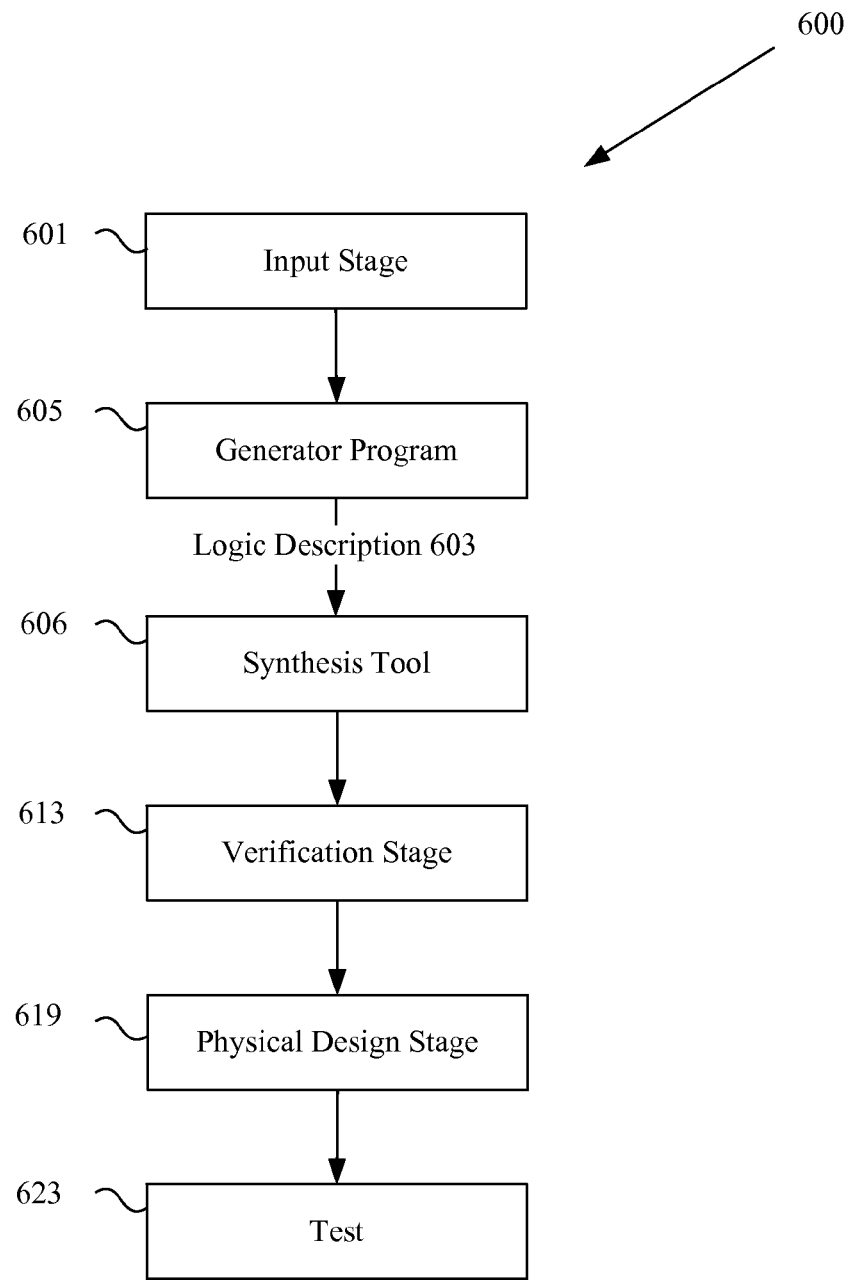
FIG. 6 illustrates a technique for implementing a programmable chip.

FIG. 6 illustrates a technique for implementing a programmable chip. An input stage 601 receives selection information typically from a user for logic such as a processor core as well as other components to be implemented on an electronic device. In one example, the input received is in the form of a high-level language program. A generator program 605 creates a logic description and provides the logic description along with other customized logic to any of a variety of synthesis tools, place and route programs, and logic configuration tools to allow a logic description to be implemented on an electronic device.

In one example, an input stage 601 often allows selection and parameterization of components to be used on an electronic device. The input stage 601 also allows configuration of hard coded logic. In some examples, components provided to an input stage include intellectual property functions, megafunctions, and intellectual property cores. The input stage 601 may be a graphical user interface using wizards for allowing efficient or convenient entry of information. The input stage may also be a text interface or a program reading a data file such as a spreadsheet, database table, or schematic to acquire selection information. The input stage 601 produces an output containing information about the various modules selected. At this stage, the user may enter security information about individual components that needs to be isolated. For example, different levels of component security and which components are allowed to communicate with each other may be entered.

In typical implementations, the generator program 605 can identify the selections and generate a logic description with information for implementing the various modules. The generator program 605 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 605 identifies pointers and provides ports for each pointer. One tool with generator program capabilities is System on a Programmable Chip (SOPC) Builder available from Altera Corporation of San Jose, Calif. The generator program 605 also provides information to a synthesis tool 607 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 601, generator program 605, and synthesis tool 607 can be separate programs. The interface between the separate programs can be a database file, a log, or simply messages transmitted between the programs. For example, instead of writing a file to storage, the input stage 601 can send messages directly to the generator program 605 to allow the generator program to create a logic description. Similarly, the generator program can provide information directly to the synthesis tool instead of writing HDL files. Similarly, input stage 601, generator program 605, and synthesis tool 607 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 607.

A synthesis tool 607 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 613 typically follows the synthesis stage 607. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 613, the synthesized netlist file can be provided to physical design tools 619 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 623.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 601, the generator program 605, the synthesis tool 607, the verification tools 613, and physical design tools 619 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 7:
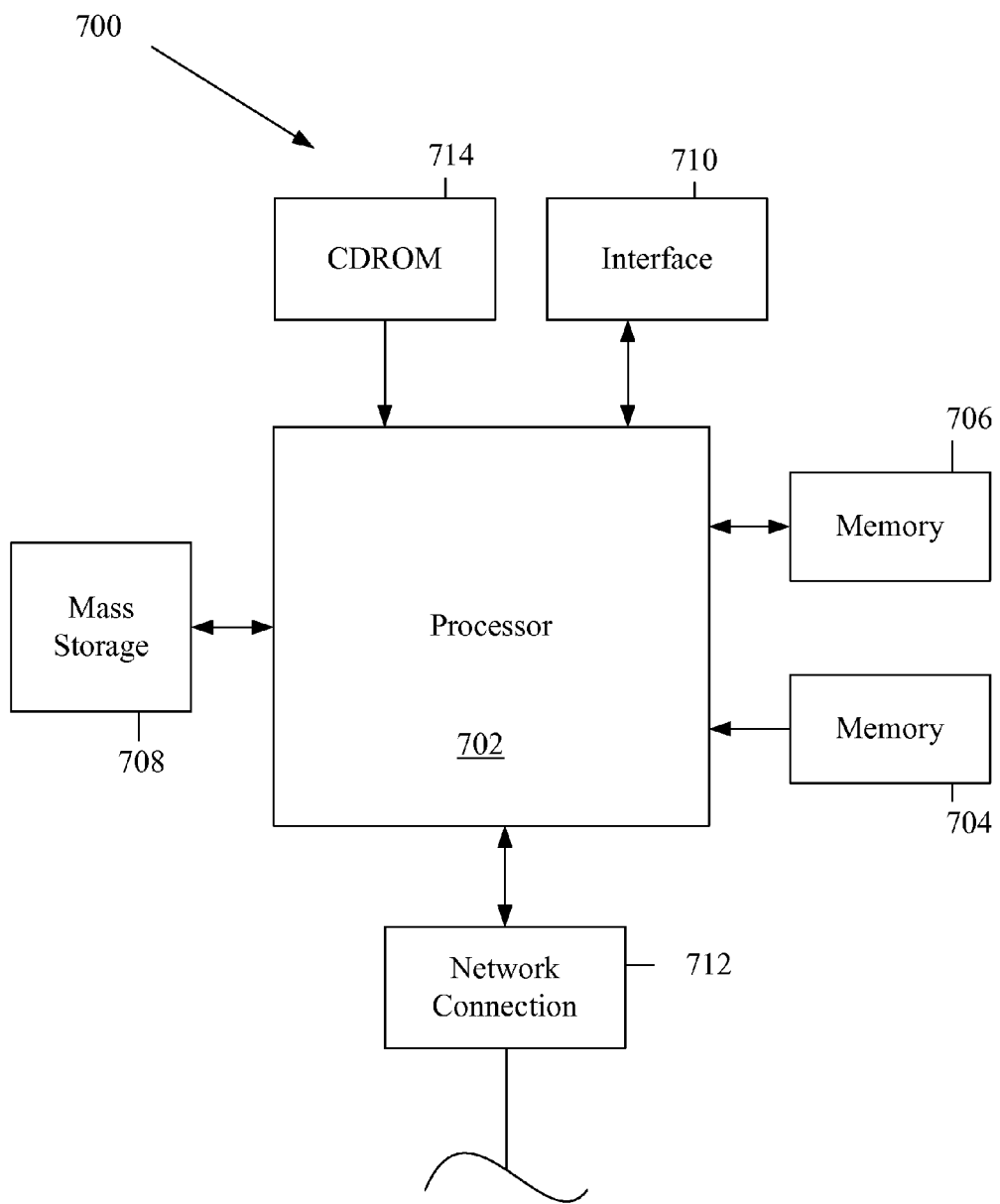
FIG. 7 illustrates one example of a computer system.

FIG. 7 illustrates one example of a computer system. The computer system 1100 includes any number of processors 702 (also referred to as central processing units, or CPUs) that are coupled to devices including memory 706 (typically a random access memory, or "RAM"), memory 704 (typically a read only memory, or "ROM"). The processors 702 can be configured to generate an electronic design. As is well known in the art, memory 704 acts to transfer data and instructions uni-directionally to the CPU and memory 706 are used typically to transfer data and instructions in a bi-directional manner.

Both of these memory devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than memory. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of memory 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 702 may be a design tool processor. Finally, CPU 702 optionally may be coupled to a computer or telecommunications network using a network connection as shown generally at 712. With such a network connection, it is contemplated that the CPU might receive information from the network, or might output information to the network in the course of performing the above-described process steps. It should be noted that the system 700 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A non-transitory computer readable medium having instructions stored thereon, the instructions executable by a processor to:
   receive a first configuration profile, the first configuration profile providing a first configuration of a set of configuration elements of an Intellectual Property (IP) core to implement a first functionality of the IP core;
   receive a second configuration profile, the second configuration profile providing a second configuration of the set of configuration elements of the IP core to implement a second functionality of the IP core;
   determine a subset of the set of configuration elements that are in opposite states between the first configuration and the second configuration of the IP core;
   generate a first configuration data associated with the first configuration profile, the first configuration data indicating settings for the subset of the set of configuration elements to implement the first functionality; and
   generate a second configuration data associated with the second configuration profile, the second configuration data indicating settings for the subset of the set of configuration elements to implement the second functionality.

2. The non-transitory computer readable medium of claim 1, wherein the first and second configuration data provide register settings associated with the IP core.

3. The non-transitory computer readable medium of claim 2, wherein generating the first and second configuration data includes providing the register settings of a subset of the registers.

4. The non-transitory computer readable medium of claim 3, further comprising:
   determine a register in the set of registers includes a first setting in the first configuration profile;
   determine the register in the set of registers includes a second setting in the second configuration profile; and
   determine a change from the first setting to the second setting is an error.

5. The non-transitory computer readable medium of claim 1, wherein the IP core is in soft logic.

6. The non-transitory computer readable medium of claim 1, wherein the IP core is in hard logic.

7. A method for implementing reconfiguration profiles for an Intellectual Property (IP) core, the method comprising:
   receiving a first configuration profile, the first configuration profile providing a first configuration of a set of configuration elements of the IP core to implement a first functionality of the IP core;

receiving a second configuration profile, the second configuration profile providing a second configuration of the set of configuration elements of the IP core to implement a second functionality of the IP core;

determining a subset of the set of configuration elements that are in opposite states between the first configuration and the second configuration of the IP core;

generating a first configuration data associated with the first configuration profile, the first configuration data indicating settings for the subset of the set of configuration elements to implement the first functionality; and generating a second configuration data associated with the second configuration profile, the second configuration data indicating settings for the subset of the set of configuration elements to implement the second functionality.

8. The method of claim 7, wherein the first and second configuration data provide register settings associated with the IP core.

9. The method of claim 8, wherein generating the first and second configuration data includes providing the register settings of a subset of the registers.

10. The method of claim 9, further comprising:
determining a register in the set of registers includes a first setting in the first configuration profile;
determining the register in the set of registers includes a second setting in the second configuration profile; and
determining a change from the first setting to the second setting is an error.

11. The method of claim 7, wherein the IP core is in soft logic.

12. The method of claim 7, wherein the IP core is in hard logic.

13. One or more computing devices for implementing reconfiguration profiles for an Intellectual Property (IP) core, the one or more computing devices comprising:
one or more processors operable to execute one or more instructions to:
receive a first configuration profile, the first configuration profile providing a first configuration of a set of configuration elements of the IP core to implement a first functionality of the IP core;
receive a second configuration profile, the second configuration profile providing a second configuration of the set of configuration elements of the IP core to implement a second functionality of the IP core;
determine a subset of the set of configuration elements that are in opposite states between the first configuration and the second configuration of the IP core;
generate a first configuration data associated with the first configuration profile, the first configuration data indicating settings for the subset of the set of configuration elements to implement the first functionality; and
generate a second configuration data associated with the second configuration profile, the second configuration data indicating settings for the subset of the set of configuration elements to implement the second functionality.

14. The one or more computing devices of claim 13, wherein the first and second configuration data provide register settings associated with the IP core.

15. The one or more computing devices of claim 14, wherein generating the first and second configuration data includes providing the register settings of a subset of the registers.

16. The one or more computing devices of claim 15, the one or more processors operable to execute one or more instructions further comprising:
determine a register in the set of registers includes a first setting in the first configuration profile;
determine the register in the set of registers includes a second setting in the second configuration profile; and
determine a change from the first setting to the second setting is an error.

17. The one or more computing devices of claim 13, wherein the IP core is in hard logic.

* * * * *